(12) United States Patent
Furukawa et al.

(10) Patent No.: US 11,006,515 B2
(45) Date of Patent: May 11, 2021

(54) MAGNETIC WIRING CIRCUIT BOARD

(71) Applicant: NITTO DENKO CORPORATION, Osaka (JP)

(72) Inventors: Yoshihiro Furukawa, Osaka (JP); Keisuke Okumura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/044,448

(22) PCT Filed: Apr. 2, 2019

(86) PCT No.: PCT/JP2019/014644
§ 371 (c)(1),
(2) Date: Oct. 1, 2020

(87) PCT Pub. No.: WO2019/198569
PCT Pub. Date: Oct. 17, 2019

(65) Prior Publication Data
US 2021/0037640 A1    Feb. 4, 2021

(30) Foreign Application Priority Data

Apr. 9, 2018    (JP) .............................. JP2018-074801

(51) Int. Cl.
*H05K 1/02*    (2006.01)
*H05K 1/03*    (2006.01)

(52) U.S. Cl.
CPC ............. *H05K 1/0224* (2013.01); *H05K 1/03* (2013.01); *H05K 2201/08* (2013.01)

(58) Field of Classification Search
CPC ......... H05K 1/0224–0227; H05K 1/03; H05K 1/0306
See application file for complete search history.

(56) References Cited

U.S. PATENT DOCUMENTS

2016/0211061 A1    7/2016  Masuda et al.

FOREIGN PATENT DOCUMENTS

| JP | H05-152130 A | 6/1993 |
| JP | H06-302436 A | 10/1994 |
| JP | 2004-363291 A | 12/2004 |
| JP | 2015-092543 A | 5/2015 |
| JP | 2017-005115 A | 1/2017 |

OTHER PUBLICATIONS

International Preliminary Report on Patentability issued by WIPO dated Oct. 13, 2020, in connection with International Patent Application No. PCT/JP2019/014644.
International Search Report Issued in PCT/JP2019/014644 dated Jun. 18, 2019.
Written Opinion Issued in PCT/JP2019/014644 dated Jun. 18, 2019.

*Primary Examiner* — Jeremy C Norris
(74) *Attorney, Agent, or Firm* — Edwards Neils LLC; Jean C. Edwards, Esq.

(57) ABSTRACT

A magnetic wiring circuit board includes an insulating layer, a plurality of wiring portions spaced from each other, a magnetic layer disposed so as to embed the plurality of wiring portions on the insulating layer, and a suppressing portion for suppressing magnetic coupling of at least the two wiring portions.

4 Claims, 10 Drawing Sheets

FIG. 8
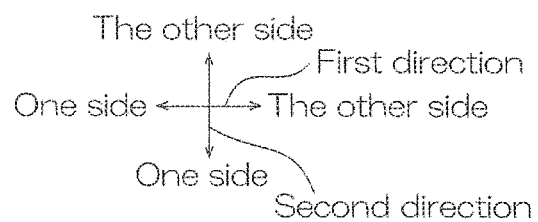
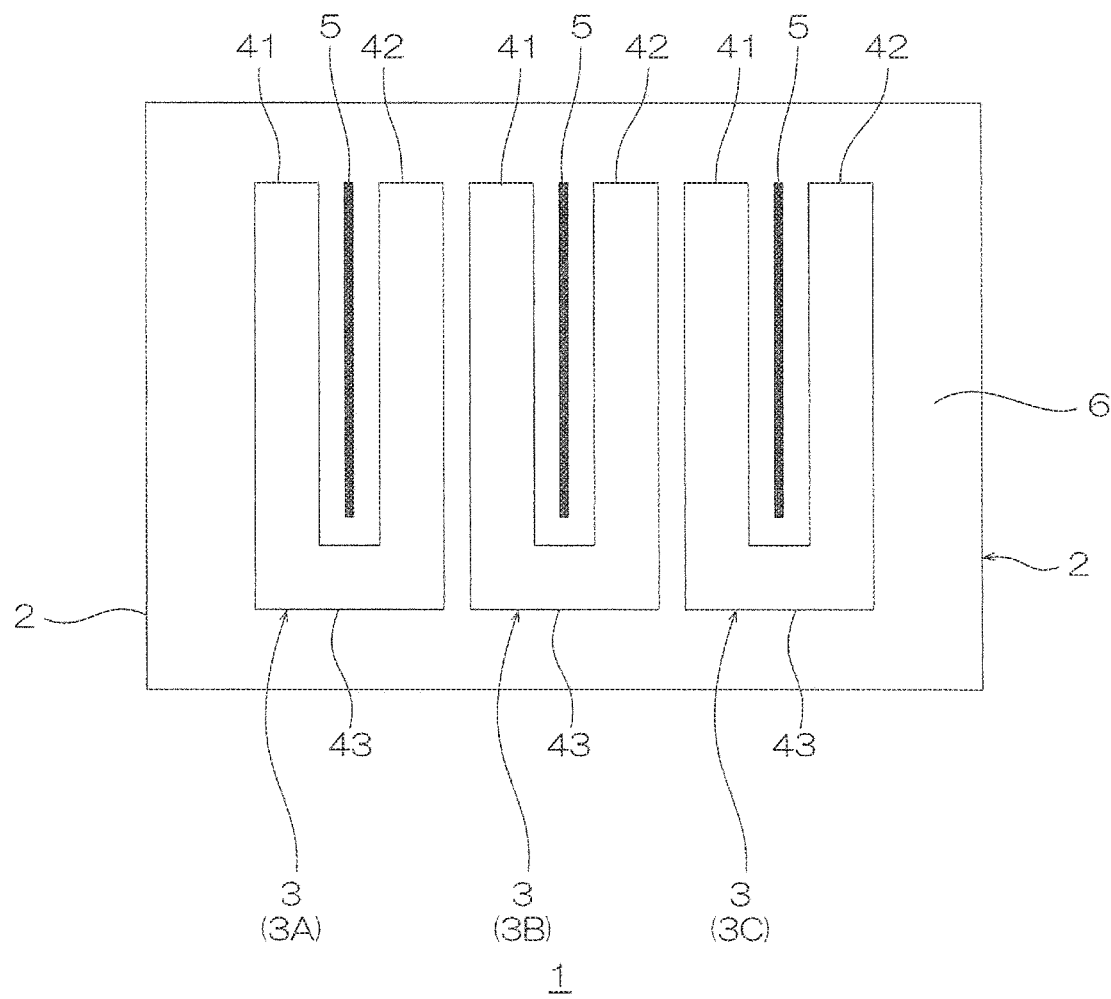

FIG. 9
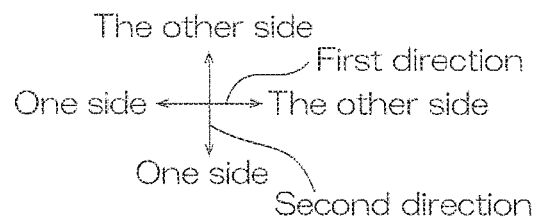
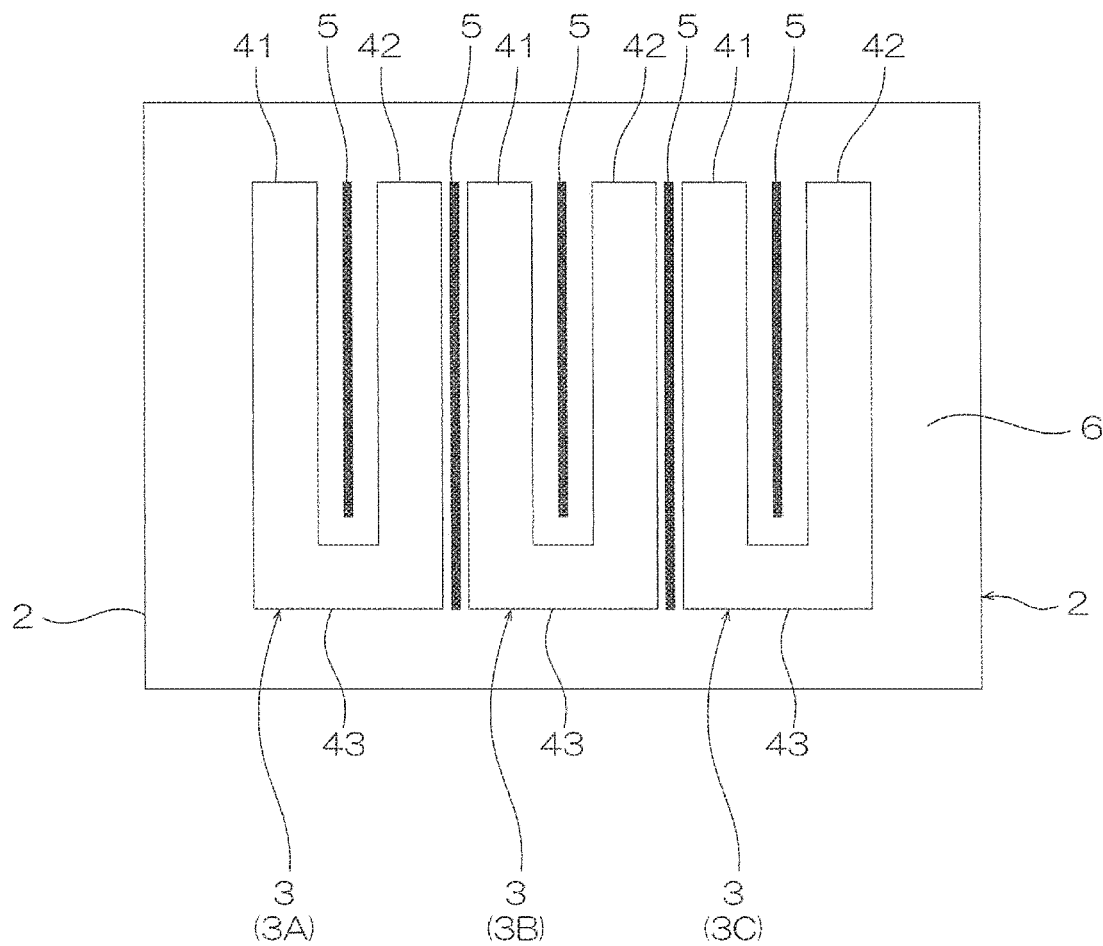

MAGNETIC WIRING CIRCUIT BOARD

CROSS-REFERENCE TO RELATED APPLICATIONS

The present application is a 35 U.S.C. 371 National Stage Entry PCT/JP2019/014644, filed on Apr. 2, 2019, which claims priority from Japanese Patent Application No. 2018-074801, filed on Apr. 9, 2018, the contents of all of which are herein incorporated by reference in their entirety.

TECHNICAL FIELD

The present invention relates to a magnetic wiring circuit board.

BACKGROUND ART

Conventionally, a magnetic wiring circuit board including a plurality of wirings and a magnetic layer for embedding the wirings has been known (ref for example, Patent Document 1).

CITATION LIST

Patent Document

Patent Document 1: Japanese Unexamined Patent Publication No. 2017-005115

SUMMARY OF THE INVENTION

Problem to be Solved by the Invention

However, in the magnetic wiring circuit board as described in Patent Document 1, the wirings adjacent to each other are easily magnetically coupled through the magnetic layer filing between them. Therefore, when a current is passed through one of the wirings, along with this, a magnetic field is generated around the one of the wirings, and this magnetic field generates an unintentional current to the other wiring, i.e., there is a problem that noise occurs (crosstalk occurs). Also, when a current is passed through the other wiring, similarly to the above, there is a problem that an unintentional current is generated in the one wiring due to the generation of the magnetic field.

The present invention provides a magnetic wiring circuit board capable of suppressing the occurrence of noise in wiring portions adjacent to each other.

Means for Solving the Problem

The present invention (1) includes a magnetic wiring circuit board including an insulating layer, a plurality of wiring portions spaced from each other in a direction perpendicular to a thickness direction on one surface in the thickness direction of the insulating layer, a magnetic layer disposed so as to embed the plurality of wiring portions on the one surface in the thickness direction of the insulating layer and having one surface in the thickness direction spaced at one side in the thickness direction with respect to one surfaces in the thickness direction of the plurality of wiring portions, and a suppressing portion for suppressing magnetic coupling of at least the two wiring portions formed so as to extend from the one surface in the thickness direction of the magnetic layer toward the other side in the thickness direction relative to a phantom line connecting the one surfaces in the thickness direction of at least the two wiring portions in the magnetic layer between at least the two wiring portions adjacent to each other.

According to the magnetic wiring circuit board, the magnetic layer extends from the one surface in the thickness direction of the magnetic layer toward the other side in the thickness direction relative to the phantom line connecting the one surfaces in the thickness direction of at least the two wiring portions, so that it is possible to suppress the magnetic coupling of the wiring portions adjacent to each other. Therefore, it is possible to suppress the occurrence of noise in the wiring portions adjacent to each other.

The present invention (2) includes the magnetic wiring circuit board described in (1), wherein the suppressing portion reaches the one surface in the thickness direction of the insulating layer.

According to the magnetic wiring circuit board, the suppressing portion reaches the one surface in the thickness direction of the insulating, layer, so that by more reliably suppressing the magnetic coupling of the wiring portions, it is possible to more reliably suppress the occurrence of noise in the wiring portions.

The present invention (3) includes the magnetic wiring circuit board described in (1) or (2), wherein the suppressing portion is a slit formed in the magnetic layer.

In the magnetic wiring circuit board, since the suppressing portion is the slit, the structure is simple.

The present invention (4) includes the magnetic wiring circuit board described in any one of (1) to (3), wherein a ratio (W/S) of a length W in the direction perpendicular to the thickness direction in the suppressing portion to a length S in the direction perpendicular to the thickness direction between at least the two wiring portions is 0.4 or less.

When the ratio of the length W in the direction perpendicular to the thickness direction in the suppressing portion to the length S in the direction perpendicular to the thickness direction between the plurality of wiring portions is high, the relative permeability between the wiring portions is excessively lowered, and the inductance of the magnetic wiring circuit board is likely to decrease.

However, in the magnetic wiring circuit board, the ratio of the length W in the direction perpendicular to the thickness direction in the suppressing portion to the length S in the direction perpendicular to the thickness direction between the plurality of wiring portions is as low as 0.4 or less, so that it is possible to ensure high inductance by suppressing an excessive decrease in the relative permeability between the wiring portions.

Effect of the Invention

According to the present invention, it is possible to suppress the magnetic coupling of the wiring portions adjacent to each other by the suppressing portion and suppress the occurrence of noise in the wiring portions adjacent to each other.

BRIEF DESCRIPTION OF THE DRAWINGS

FIG. 3A illustrating a step of preparing a wiring circuit board and a magnetic sheet, FIG. 3B illustrating a step of thermally pressing the magnetic sheet toward the wiring circuit board, and FIG. 3C illustrating a step of forming a suppressing portion.

FIG. 8 shows a modified example of the magnetic wiring circuit board shown in FIG. 1.

FIG. 9 shows a modified example of the magnetic wiring circuit board shown in FIG. 1.

DESCRIPTION OF EMBODIMENTS

One Embodiment

Figure 1:
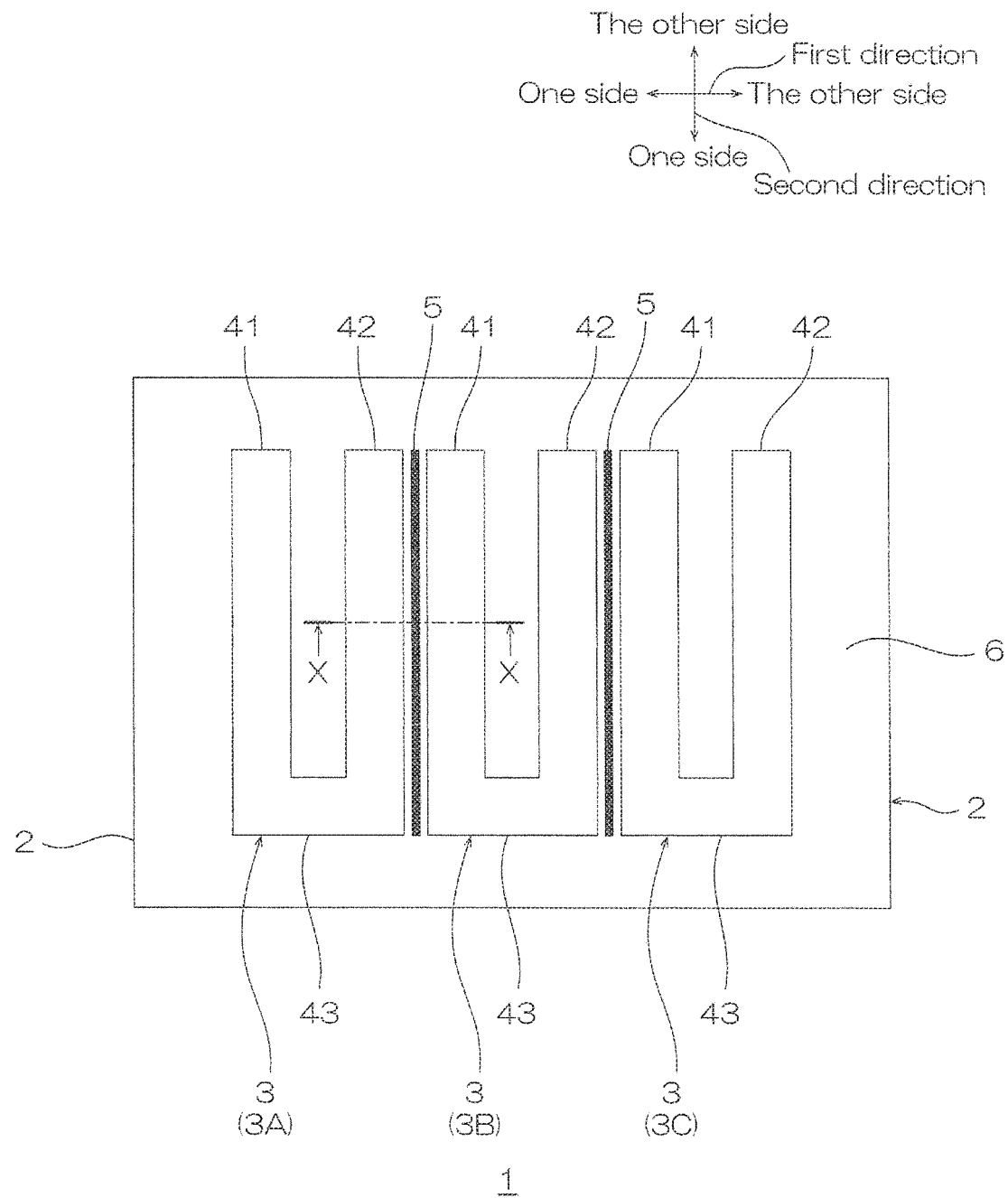
FIG. 1 shows a plan view of one embodiment of a magnetic wiring circuit board of the present invention.

A wiring circuit board 1 of one embodiment of a wiring circuit board of the present invention is described with reference to FIGS. 1 and 2.

The magnetic wiring circuit board 1 has one surface and the other surface in a thickness direction facing each other in the thickness direction, and has a sheet shape extending in a plane direction (direction perpendicular to the thickness direction) (plane direction including a first direction and a second direction to be described later).

The magnetic wiring circuit board 1 includes an insulating layer 2, a plurality of wirings 3, a magnetic layer 4, and a suppressing portion 5.

The insulating layer 2 has a sheet shape extending in the plane direction. The insulating layer 2 has a first insulating surface 6 that is one surface in the thickness direction and a second insulating surface 7 that is the other surface in the thickness direction. The insulating layer 2 is a support material for supporting the plurality of wirings 3 to be described next, and thus, also a support layer for supporting the magnetic wiring circuit board 1. The insulating layer 2 has flexibility. Examples of a material of the insulating layer 2 include resin materials such as a polyimide resin, a polyester resin, and an acrylic resin. The insulating layer 2 may be a single layer or multiple layers. A thickness of the insulating layer 2 is not particularly limited, and is, for example, 1 μm or more and 1000 μm or less.

The plurality of wirings 3 are disposed at intervals from each other in the first direction (the direction corresponding to a right-left direction in FIG. 2 and included in the plane direction) on the first insulating surface 6 of the insulating layer 2. As shown in FIG. 1, for example, the wiring 3 has a first wiring 3A, a second wiring 3B, and a third wiring 3C disposed in parallel at intervals in the first direction. The first wiring 3A, the second wiring 3B, and the third wiring 3C are disposed in order from one side toward the other side in the first direction.

A shape of each of the plurality of wirings 3 when viewed from the top (viewed in the thickness direction) is, for example, a generally U-shape. Each of the plurality of wirings 3 integrally includes a first wiring portion 41 and a second wiring portion 42 as an example of a plurality of wiring portions extending in the second direction perpendicular to the thickness direction and the first direction (the direction corresponding to the depth direction on the plane of the sheet in FIG. 2), and a connecting wiring portion 43 for connecting one end portions in the second direction of the first, wiring portion 41 and the second wiring portion 42.

The first wiring portion 41 and the second wiring portion 42 are oppositely disposed at intervals in the first direction (an example of a predetermined direction). The first wiring portion 41 and the second wiring portion 42 are adjacent at intervals in a cross-sectional view perpendicular to the second direction (cut surface along the first direction and the thickness direction) (cut surface shown in FIG. 2).

The plurality of first wiring portions 41 and the plurality of second wiring portions 42 are provided in the magnetic wiring circuit board 1, since the plurality of wirings 3 are provided.

A cross-sectional shape of each of the first wiring portion 41 and the second wiring portion 42 (to be more specific, the cross-sectional shape when cut along the thickness direction and the first direction) is not particularly limited, and may be, for example, a generally rectangular shape.

Each of the first wiring portion 41 and the second wiring portion 42 integrally includes a first wiring surface 8 which is the one surface in the thickness direction disposed oppositely fit intervals on one side in the thickness direction with respect to the first insulating surface 6 of the insulating layer 2, a second wiring surface 9 in contact with the first insulating surface 6 of the insulating layer 2, and third wiring surfaces 10 which are side surfaces for connecting both end edges in the first direction of the first wiring surface 8 and the second wiring surface 9.

The first wiring surface 8 is a flat surface along the first direction.

The second wiring surface 9 is a flat surface parallel to the first wiring surface 8.

The third wiring surfaces 10 extend along the thickness direction. The two third wiring surfaces 10 are provided in each of the first wiring portion 41 and the second wiring portion 42. The two third wiring surfaces 10 are oppositely disposed at intervals in the first direction.

The connecting wiring portion 43 has the same cross-sectional shape as each of the first wiring portion 41 and the second wiring portion 42.

Examples of a material of the wiring 3 include metals (conductors) such as copper.

The wiring 3 has a thickness of, for example, 10 μm or more, preferably 30 μm or more, and for example, 500 μm or less, preferably 250 μm or less. A width of the first wiring portion 41 and the second wiring portion 42 is, for example, 20 μm or more and 2000 μm or less. An interval between the first wiring portion 41 and the second wiring portion 42 is, for example, 20 μm or more, preferably 50 μm or more, and for example, 2000 μm or less, preferably 1500 μm or less.

A ratio (thickness/width) of the thickness of the wiring 3 (the last wiring portion 41 and the second wiring portion 42) to the width of the first wiring portion 41 and the second wiring portion 42 is, for example, 0.005 or more, preferably 0.015 or more, and for example, 25 or less, preferably 12.5 or less. A ratio (thickness/interval) of the thickness of the wiring 3 to the interval between the first wiring portion 41 and the second wiring portion 42 is, for example, 0.005 or more, preferably 0.02 or more, and for example, 25 or less, preferably 5 or less.

The wiring 3, together with the insulating layer 2 described above, is provided in a wiring circuit board 15. In other words, the wiring circuit board 15 includes the insulating layer 2 and the plurality of wirings 3. Preferably, the wiring circuit board 15 consists of only the insulating layer 2 and the plurality of wirings 3.

The magnetic layer 4 has a sheet shape extending in the plane direction. The magnetic layer 4 is disposed on the first insulating surface 6 of the insulating layer 2 so as to embed the plurality of wirings 3. The magnetic layer 4 has a first magnetic surface 11 and a second magnetic surface 12 disposed at intervals on the other side in the thickness direction of the first magnetic surface 11.

The first magnetic surface 11 is disposed at intervals on one side in the thickness direction with respect to at least the first wiring surface 8 of the first wiring portion 41 and the second wiring portion 42. Specifically, the first magnetic surface 11 includes a plurality of convex portions 13 which are raised toward one side in the thickness direction corresponding to the first wiring portion 41 and the second wiring portion 42, and a recessed portion 14 which is disposed between the convex portions 13 adjacent to each other and sinks toward the other side in the thickness direction with respect to the convex portion 13. The recessed portion 14 (more specifically, the other end edge in the thickness direction of the recessed portion 14) is located at intervals on one side in the thickness direction relative to a phantom line IL connecting the first wiring surfaces 8 of the first wiring portion 41 and the second wiring portion 42.

The second magnetic surface 12 covers the first insulating surface 6 exposed from the wiring 3 in the insulating layer 2, and the first wiring surface 8 and the third wiring surfaces 10 of the wiring 3.

An example of a material of the magnetic layer 4 includes a magnetic composition containing magnetic particles and a resin component. Examples of the magnetic particles include soft magnetic particles such as Sendust from the viewpoint of magnetic properties. Examples of the resin component include thermosetting resins such as an epoxy resin composition containing an epoxy resin, a curing agent, and a curing accelerator. Such a magnetic composition is described in, for example, Japanese Unexamined Patent Publications No. 2017-005115 and 2015-092543.

A content ratio of the magnetic particles in the magnetic layer 4 is, for example, 50% by volume or more, preferably 55% by volume or more, and for example, 95% by volume or less, preferably 90% by volume or less.

The relative permeability of the magnetic layer 4 is, for example, 3 or more, preferably 5 or more, more preferably 10 or more, and for example, 1000 or less.

The suppressing portion 5 suppresses magnetic coupling of the two wiring portions adjacent to each other. The suppressing portion 5 is formed so as to extend from the first magnetic surface 11 of the magnetic layer 4 toward the other side in the thickness direction relative to the phantom line IL connecting the first wiring surfaces 8 of the first wiring portion 41 and the second wiring portion 42 in the magnetic layer 4 between the second wiring portion 42 of one wiring 3 and the first wiring portion 41 of the other wiring 3 adjacent to the one wiring 3 in the two wirings 3 adjacent to each other (the one wiring 3 and the other wiring 3). Specifically, the suppressing portion 5 is formed between the second wiring portion 42 of the first wiring 3A and the first wiring portion 41 of the second wiring 3B, and between the second wiring portion 42 of the second wiring 3B and the first wiring portion 41 of the third wiring 3C.

The suppressing portion 5 reaches the last insulating surface 6 of the insulating layer 2 from the first magnetic surface 11 of the magnetic layer 4.

Specifically, the suppressing portion 5 is a slit (void portion, gap, opening portion) 25 formed in the magnetic layer 4. Preferably, the suppressing portion 5 consists of only the slit 25 (unlike the modified example shown in FIG. 6 to be described later, does not include a filling portion 20). Furthermore, the suppressing portion 5 has a generally linear cross-sectional shape extending from the recessed portion 14 of the magnetic layer 4 along the thickness direction. In other words, the suppressing portion 5 has a shape in which a width (length in the first direction) W thereof is the same in the thickness direction. The suppressing portion 5 divides (separates) the magnetic layer 4 in the first direction in a cross-sectional view (cross section along the thickness direction and the first direction).

The suppressing portion 5 is formed between the two wiring portions so as to be parallel to them that are adjacent to each other along the second direction. The suppressing portion 5 has, for example, a generally straight shape when viewed from the top along the second wiring portion 42 of the one wiring 3 and the first wiring portion 41 of the other wiring 3.

A ratio (W/S) of the width (length in the first direction) W of the suppressing portion 5 to an interval S between the first wiring portion 41 and the second wiring portion 42 adjacent to each other is, for example, 0.7 or less, preferably 0.5 or less, more preferably 0.4 or less, further more preferably 0.3 or less, particularly preferably 0.2 or less, most preferably 0.1 or less, and for example, 0.01 or more. When the ratio (W/S) described above is the above-described upper limit or less, it is possible to ensure high inductance in the magnetic wiring circuit board 1 by suppressing an excessive decrease in the relative permeability between the wirings 3.

In particular, when the ratio (W/S) is above 0.4, the effect of suppressing the magnetic coupling of the wirings 3 cannot be obtained, while only the inductance density tends to be lowered, and when the ratio (W/S) is 0.4 or less, the above-described decrease in only the inductance density can be suppressed.

Specifically, the length (width) W in the first direction of the suppressing portion 5 is, for example, 100 μm or less, preferably 80 μm or less, more preferably 60 μm or less, and for example, 1 μm or more.

A length in the thickness direction of the suppressing portion 5 is the same as the thickness of the magnetic layer 4 in the recessed portion 14.

The relative permeability in the suppressing portion 5 is substantially 1 (in detail, a value approximating 1 of the relative permeability of the vacuum), when the suppressing portion 5 is the slit 25 and the air is present in the suppressing portion 5.

A thickness of the magnetic wiring circuit board 1, as its maximum thickness, is, for example, 30 μm or more, preferably 50 μm or more, and for example, 1000 μm or less, preferably 800 μm or less.

Figure 3:
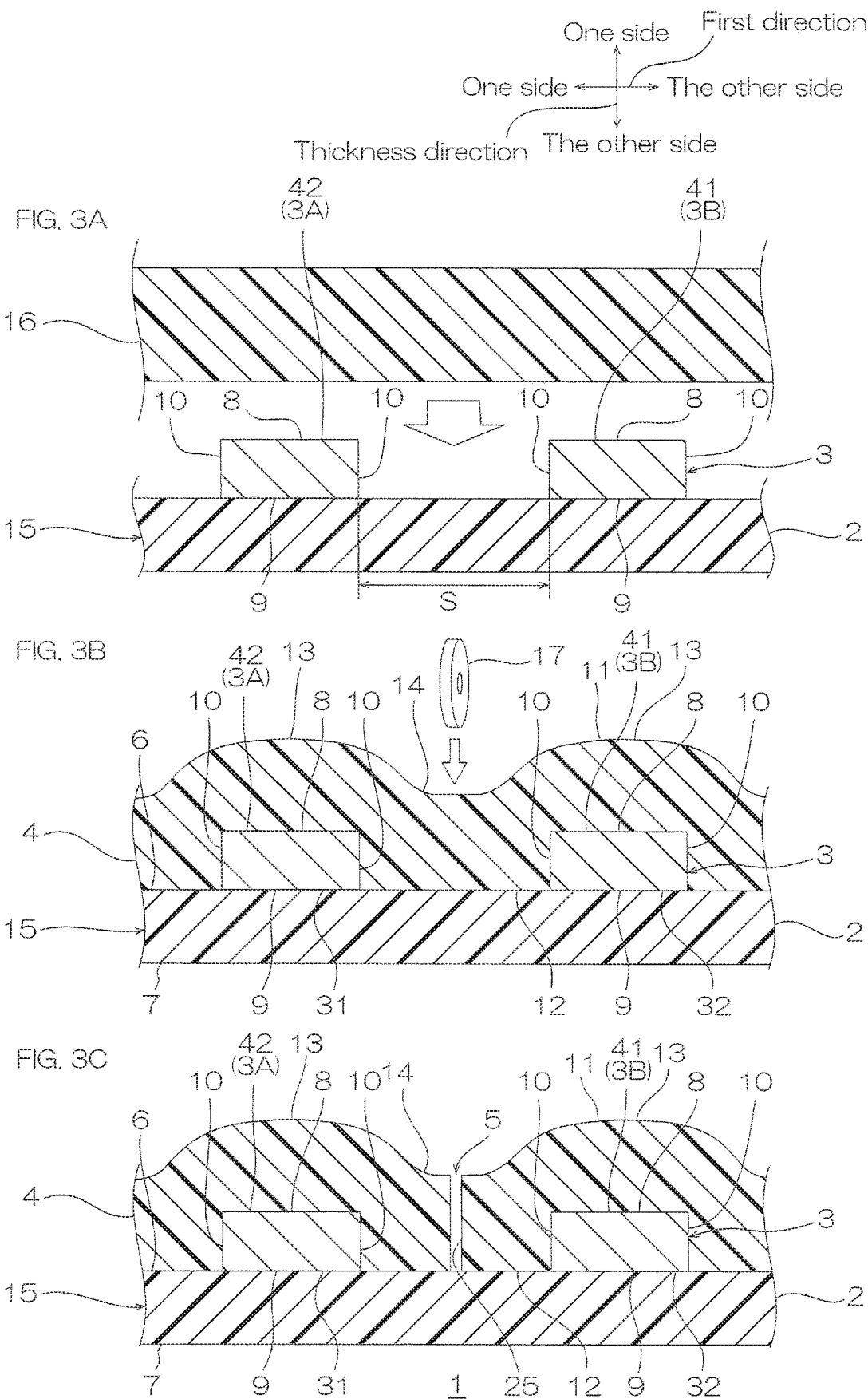
FIGS. 3A to 3C show a manufacturing process diagram of the magnetic wiring circuit board shown in FIG. 2.

Next, a method for producing the magnetic wiring circuit board 1 is described by referring to FIGS. 3A to 3C.

As shown in FIG. 3A, first, the wiring circuit board 15 including the insulating layer 2 and the wiring 3 is prepared.

Subsequently, a magnetic sheet 16 is prepared. For example, the above-described magnetic composition containing the magnetic particles and the resin component (preferably, a B-stage thermosetting resin) is formed into a sheet shape to prepare the magnetic sheet 16.

Thereafter, as shown by an arrow of FIG. 3A, the magnetic sheet 16 embeds the plurality of wirings 3 in the wiring circuit board 15. For example, when the magnetic sheet 16 contains the B-stage thermosetting resin, the magnetic sheet 16 is thermally pressed toward the wiring circuit board 15.

Thus, the magnetic sheet 16 is formed (molded) into a shape corresponding to the wiring 3 (at least the first wiring portion 41 and the second wiring portion 42). That is, the magnetic layer 4 is formed from the magnetic sheet 16.

The suppressing portion 5 is not yet formed in the magnetic layer 4.

As shown in FIG. 3C, the suppressing portion 5 is formed in the magnetic layer 4.

In order to form the suppressing portion 5 in the magnetic layer 4, for example, a cutting device (cutter) is used.

Examples of the cutting device include a contact-type cutting device that is in physical contact with the magnetic layer 4 such as a dicing device and a non-contact-type cutting device that is not in physical contact with the magnetic layer 4 such as a laser device.

As the cutting device, from the viewpoint of accuracy of shape control, preferably, a contact-type cutting device is used, from the viewpoint of shortening the working time (tact time), preferably, a non-contact-type cutting device is used.

A dicing device as an example of a contact-type cutting device includes a support base (not shown), a dicing saw 17 which is oppositely disposed at a distance therefrom, and a moving device for moving the dicing saw 17 (not shown).

An example of the dicing saw 17 includes a dicing blade having a disk shape.

To form the suppressing portion 5 with the dicing device, first, the wiring circuit board 15 and the magnetic layer 4 are installed on the support base (not shown) of the dicing device. Thus, the dicing saw 17 is disposed at intervals on one side in the thickness direction of the magnetic layer 4. Subsequently, the peripheral end of the dicing saw 17 is brought into contact with the first magnetic surface 11 (specifically, the recessed portion 14) of the magnetic layer 4.

Subsequently, the dicing saw 17 is moved (pulled down) toward the other side in the thickness direction until its peripheral end reaches the first insulating surface 6 of the insulating layer 2. Thereafter, the dicing saw 17 is moved along the second direction. Thus, the suppressing portion 5 that is the slit 25 is formed along the second direction.

Thus, the magnetic wiring circuit board 1 including the wiring circuit board 15, the magnetic layer 4, and the suppressing portion 5 is obtained.

Thereafter, when the magnetic layer 4 contains the B-stage thermosetting resin, if necessary, the magnetic layer 4 is brought into a C-stage state (fully cured), for example, by heating.

The magnetic wiring circuit board 1 is, for example, used in wireless power transmission (wireless power supply and/or wireless power receiving), wireless communication, sensors, passive components, and the like.

Then, according to the magnetic wiring circuit board 1, the suppressing portion 5 extends from the first magnetic surface 11 of the magnetic layer 4 toward the other side in the thickness direction relative to the phantom line IL connecting the first wiring surfaces 8 of the two wirings 3 adjacent to each other (the second wiring portion 42 of the one wiring 3, and the first wiring portion 41 of the other wiring 3). Therefore, it is possible to suppress the magnetic coupling of the two wirings 3. Therefore, it is possible to suppress the occurrence of noise in the two wirings 3.

According to the magnetic wiring circuit board 1, the suppressing portion 5 reaches the first insulating surface 6 of the insulating layer 2. Therefore, by more reliably suppressing the magnetic coupling of the two wirings 3, it is possible to more reliably suppress the occurrence of noise in the two wirings 3 (the second wiring portion 42 of the one wiring 3, and the first wiring portion 41 of the other wiring 3).

Furthermore, in the magnetic wiring circuit board 1, since the suppressing portion 5 is the slit 25, it is possible to suppress the occurrence of noise in the two wirings 3 (the second wiring portion 42 of the one wiring 3, and the first wiring portion 41 of the other wiring 3) in a simple structure.

When the ratio of the width W of the suppressing portion 5 to the interval S between the plurality of wirings 3 is high, the relative permeability between the wirings 3 is excessively lowered, and the inductance of the magnetic wiring circuit board 1 is likely to decrease. Furthermore, the magnetic layer 4 between the wirings 3 is excessively removed, and as a result, a magnetic field generated from the second wiring portion 42 of the one wiring 3 is also spread to the first wiring portion 41 of the other wiring 3, so that the magnetic coupling of the wirings 3 is enhanced.

However, in the magnetic wiring circuit board 1, when the ratio of the width W of the suppressing portion 5 to the interval S between the plurality of wirings 3 is as low as 0.4 or less, it is possible to ensure high inductance by suppressing an excessive decrease in the relative permeability between the wirings 3.

MODIFIED EXAMPLES

In the following each of the modified examples, the same reference numerals are provided for members and steps corresponding to each of those in the above-described one embodiment, and their detailed description is omitted. Each of the modified examples can achieve the same function and effect as that of one embodiment unless otherwise specified. Furthermore, one embodiment and the modified examples thereof can be appropriately used in combination.

Figure 2:
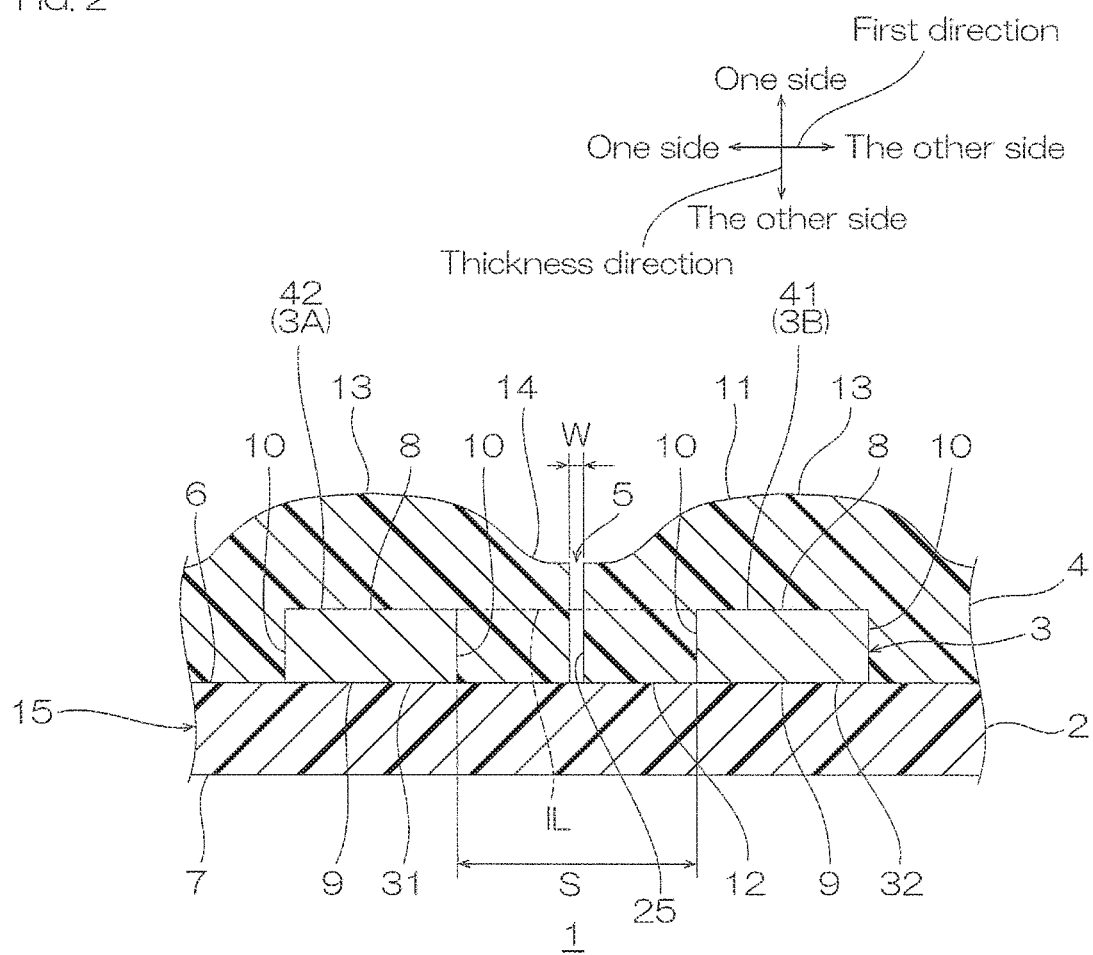
FIG. 2 shows a cross-sectional view along an X-X line of the magnetic wiring circuit board shown in FIG. 1.

As shown in FIG. 2, in one embodiment, the suppressing portion 5 extends from the first magnetic surface 11 of the magnetic layer 4 to reach the first insulating surface 6 of the insulating layer 2.

Figure 4:
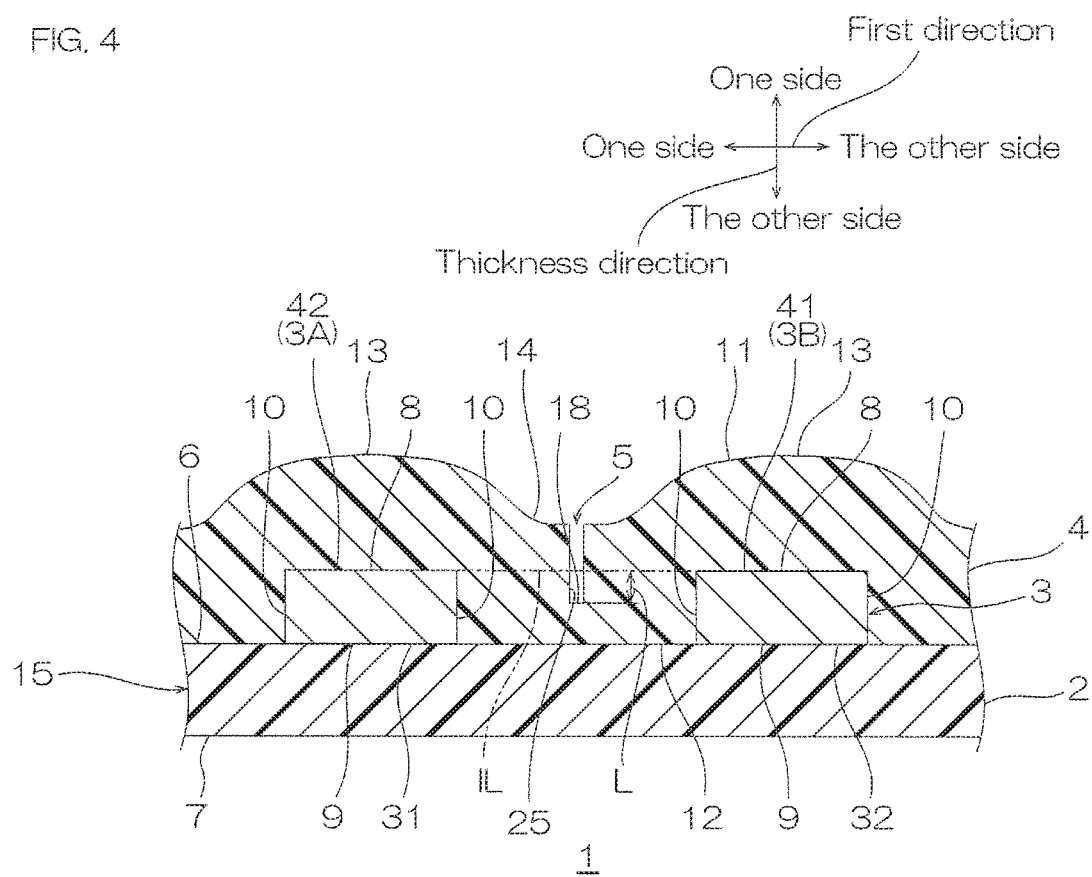
FIG. 4 shows a modified example of the magnetic wiring circuit board shown in FIG. 2, and an embodiment in which a suppressing portion extends halfway in the thickness direction of a magnetic layer.

However, as shown in FIG. 4, in this modified example, the suppressing portion 5 does not reach the first insulating surface 6 of the insulating layer 2, and is separated from the first insulating surface 6. Specifically, the suppressing portion 5 is a suppression recessed portion that is recessed from the first magnetic surface 11. The suppressing portion 5 is opened toward one side in the thickness direction. The suppressing portion 5 has a bottom portion 18 located on the other side in the thickness direction relative to the above-described phantom line IL.

The bottom portion 18 is located between the phantom line IL and the first insulating surface 6 of the insulating layer 2.

A depth of the suppressing portion 5 is not particularly limited as long as the bottom portion 18 is located on the other side in the thickness direction relative to the phantom line IL. A ratio of a distance L between the bottom portion 18 and the phantom line IL to the thickness of the wiring 3 (the distance L/the thickness of the wiring 3) is, for example, 0.1 or more, preferably 0.2 or more, and for example, below 1, preferably 0.9 or less.

When the ratio is the above-described lower limit or more, the magnetic coupling of the wirings 3 adjacent to each other can be effectively suppressed. When the ratio is the above-described upper limit or less, the strength of the magnetic layer 4 can be ensured.

As shown in FIG. 2, in one embodiment, the magnetic layer 4 is in contact with the first wiring surface 8 and the third wiring surfaces 10 of the wiring 3. That is, the magnetic layer 4 is directly disposed on the first wiring surface 8 and the third wiring surfaces 10.

Figure 5:
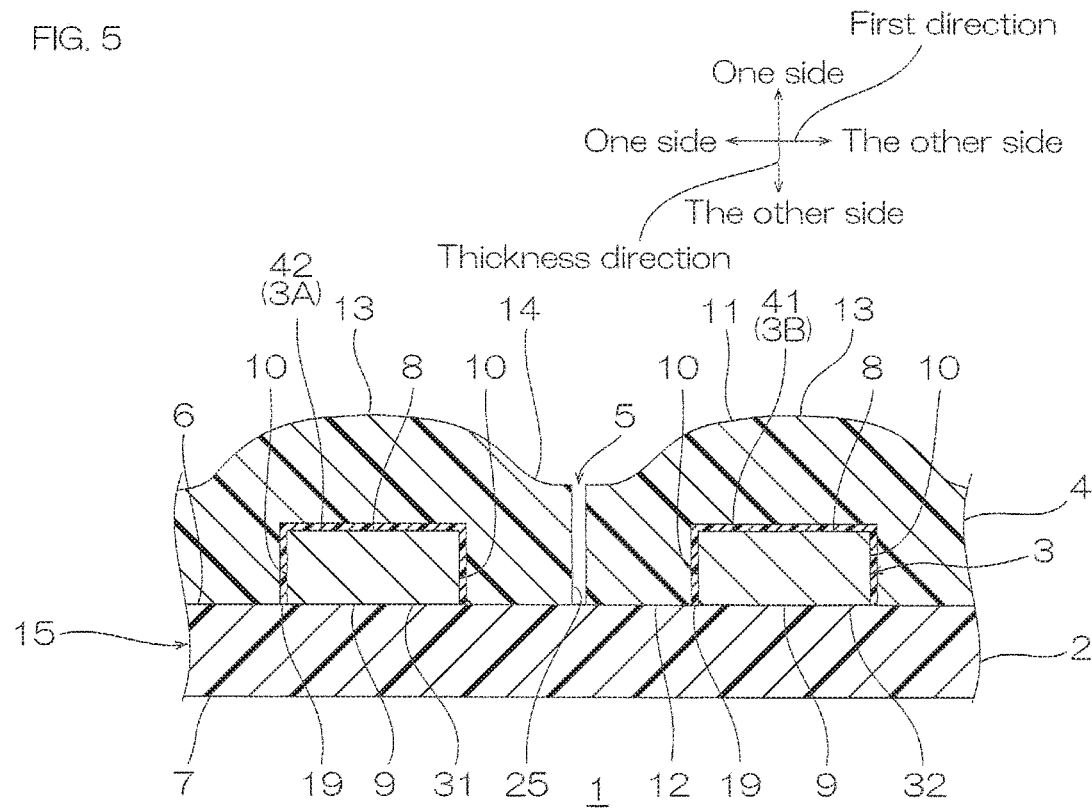
FIG. 5 shows a modified example of the magnetic wiring circuit board shown in FIG. 2, and furthermore, an embodiment including a second insulating layer.

Alternatively, as shown in FIG. 5, the magnetic layer 4 may not be in contact with the first wiring surface 8 and the third wiring surfaces 10 of the wiring 3, and may be disposed indirectly in the first wiring surface 8 and the third wiring surface 10.

In the modified example, a second insulating layer 19 is interposed between the magnetic layer 4 and the wiring 3.

The second insulating layer 19 has a thin film shape along the first wiring surface 8 and the third wiring surfaces 10 of the wiring 3. The second insulating layer 19 does not have, for example, magnetic properties. Specifically, examples of a material of the second insulating layer 19 include resin materials without containing the magnetic particles. The resin material of the second insulating layer 19 is the same as the resin material illustrated in the insulating layer 2. The second insulating layer 19 has a thickness of, for example, 10 μm or less and 0.1 μm or more.

Figure 6:
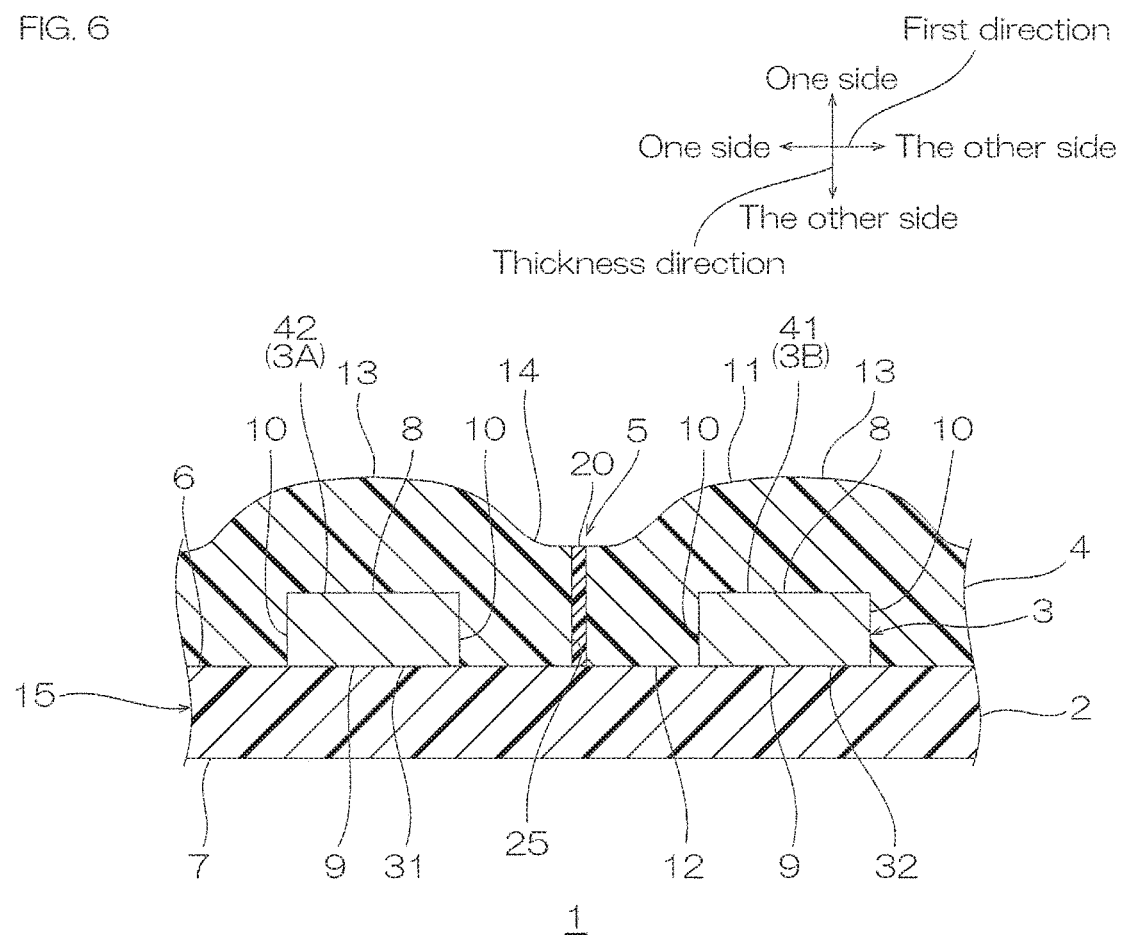
FIG. 6 shows a modified example of the magnetic wiring circuit board shown in FIG. 2, and an embodiment in which a suppressing portion includes a filling portion.

In one embodiment, as shown in FIG. 2, the suppressing portion 5 consists of only the slit 25. Alternatively, for example, as shown in FIG. 6, the suppressing portion 5 can also include the slit 25 and the filling portion 20 that fills the slit 25. In the modified example, the suppressing portion 5 preferably consists of only the slit 25 and the filling portion 20.

Examples of a material of the filling portion 20 include low-permeability materials. Examples of the low-permeability material include resin materials without containing the magnetic particles.

Preferably, as in one embodiment, as shown in FIG. 2, the suppressing portion 5 consists of only the slit 25. According to one embodiment, the relative permeability of the suppressing portion 5 can be reliably set lower than that of the suppressing portion 5 further including the filling portion 20 shown in FIG. 6, so that the magnetic coupling of the wirings 3 can be effectively suppressed.

The insulating layer 2 may be also a magnetic insulating layer containing the magnetic particles and having the magnetic properties.

As shown in FIGS. 3A and 3B, in one embodiment, the magnetic layer 4 is formed of the magnetic sheet 16. Alternatively, for example, a varnish of a magnetic composition may be also prepared and applied to form the magnetic layer 4.

As shown in FIGS. 3B and 3C, in one embodiment, the magnetic layer 4 and the suppressing portion 5 are formed by separate steps. Alternatively, though not shown, it is also possible to form them in one step. For example, a wall member (or post) having the same shape as the suppressing portion 5 is installed on the first insulating surface 6 between the two wirings 3, subsequently, the magnetic layer 4 is formed into a shape corresponding to the wall member, and then, the wall member is removed (e.g., pulled toward one side in the thickness direction). As a result, the magnetic layer 4 and the suppressing portion 5 are formed at one time.

Figure 7:
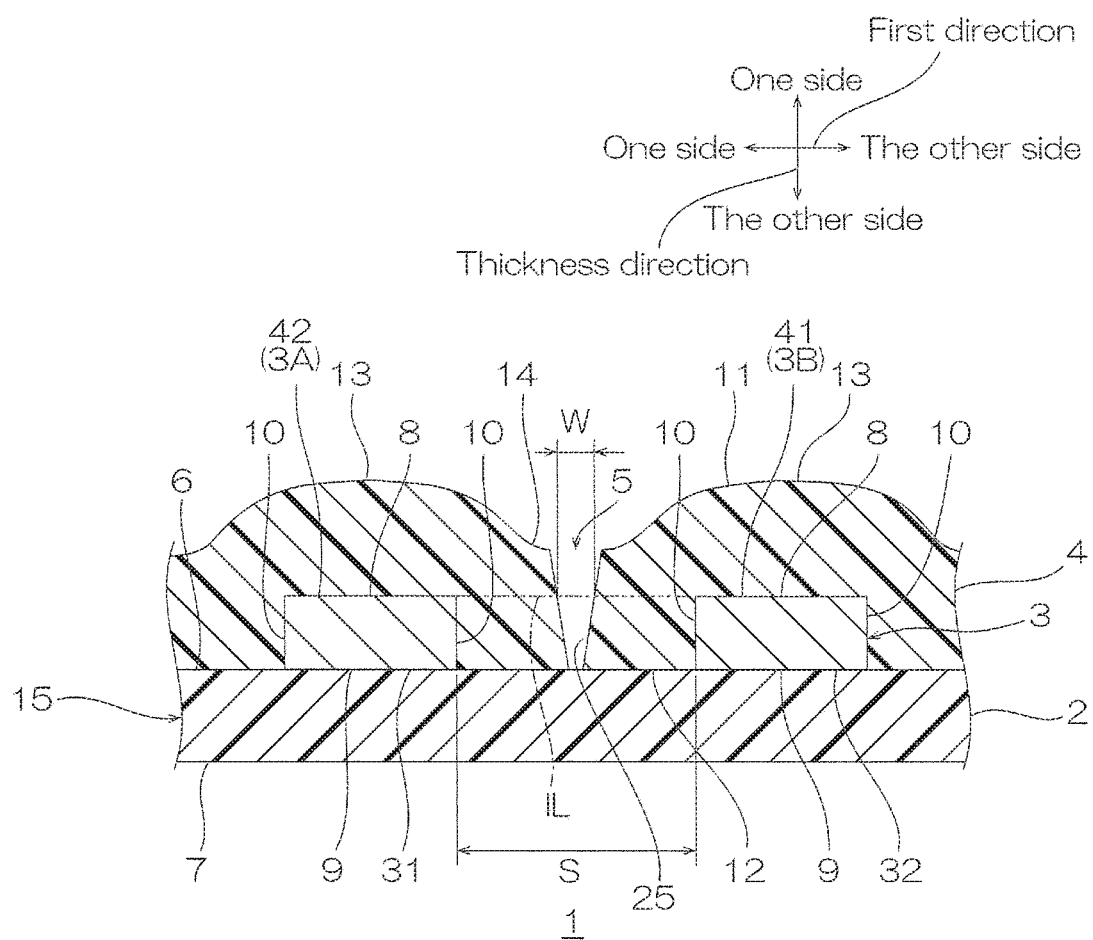
FIG. 7 shows a modified example of the magnetic wiring circuit board shown in FIG. 2, and an embodiment in which a suppressing portion (slit) has a tapered shape.

In one embodiment, as shown in FIG. 2, the suppressing portion 5 has a generally linear cross-sectional shape extending from the first magnetic surface 11 of the magnetic layer 4 along the thickness direction. However, the cross-sectional shape of the suppressing portion 5 (the slit 25) is not limited thereto. For example, as shown in FIG. 7, the suppressing portion 5 may also have the opening area (or the opposing length in the first direction) in a tapered shape that becomes gradually smaller (narrower) toward the other side in the thickness direction.

In this case, the width W of the suppressing portion 5 is defined as the length on the phantom line IL in the suppressing portion 5. When the width W of the suppressing portion 5 is adjusted so that the W/S satisfies, for example, 0.4 or less, the same function and effect as described above (suppression of an excessive decrease in the relative permeability between the wirings 3) can be achieved.

In one embodiment, as shown in FIG. 1, the suppressing portion 5 is formed between the two wirings 3 adjacent to each other. Alternatively, for example, as shown in FIG. 8, the suppressing portion 5 may be also disposed between the two wiring portions in the one wiring 3, i.e., between the first wiring portion 41 and the second wiring portion 42.

Furthermore, as shown in FIG. 9, the suppressing portion 5 may be also disposed both between the two wirings 3 adjacent to each other, and between the first wiring portion 41 and the second wiring portion 42 in the one wiring 3.

Although not shown, the suppressing portion 5 can also have a wide portion which is wider than the width W defined above and disposed on the other side in the thickness direction relative to the phantom line IL. A shape of the wide portion is not particularly limited, and includes, for example, a generally circular arc shape, a generally wave shape, and the like. A width (the second width, the length in the first direction) of the wide portion is, for example, 1.4 or less and above 1 with respect to the width (the first width) W described above.

In one embodiment, the magnetic layer 4 is brought into a C-stage state after forming the portion 5, and the order may be reversed.

For example, a pattern shape of the wiring 3 is not particularly limited, and includes, for example, a generally coil shape, a generally loop shape, a generally S shape, and the like.

EXAMPLES

Next, the present invention is further described based on Examples and Comparative Example shown below. The present invention is however not limited by these Examples and Comparative Example. The specific numerical values in mixing ratio (ratio), property value, and parameter used in the following description can be replaced with upper limit values (numerical values defined as "or less" or "below") or lower limit values (numerical values defined as "or more" or "above") of corresponding numerical values in mixing ratio (ratio), property value, and parameter described in the above-described "DESCRIPTION OF EMBODIMENTS".

Example 1

As shown in FIGS. 1 and 3A, the wiring circuit board 15 including the insulating layer 2 and the plurality of wirings 3 was prepared.

In the wiring circuit board 15, the insulating layer 2 was made of a polyimide resin and had a thickness of 5 μm. In the wiring circuit board 15, the plurality of wirings 3 were made of copper and had a thickness of 100 μm. Each of the plurality of wirings 3 (the first wiring 3A, the second wiring 3B, and the third wiring 3C) had the first wiring portion 41, the second wiring portion 42, and the connecting wiring portion 43. In each wiring 3, the first wiring portion 41 and the second wiring portion 42 had a width of 300 µm and an interval of 300 µm. The interval S between the second wiring portion 42 of the one wiring 3 and the first wiring portion 41 of the other wiring 3 was 100 µm.

The magnetic sheet 16 was prepared separately.

The magnetic sheet 16 was formed from a magnetic composition containing 60% by volume of Sendust and 40% by volume of a thermosetting resin (epoxy resin composition).

As shown in FIG. 3B, then, the magnetic sheet 16 was thermally pressed toward the wiring circuit board 15 to form the magnetic layer 4.

Thereafter, as shown in FIGS. 3B and 3C, the slit 25 extending from the first magnetic surface 11 of the magnetic layer 4 to reach the first insulating surface 6 of the insulating layer 2 was formed in the magnetic layer 4 with the dicing saw 17, thereby forming the suppressing portion 5.

The width W of the suppressing portion 5 was 40 µm. The ratio (W/S) of the interval S between the plurality of wirings 3 to the width W of the suppressing portion 5 was 0.4.

Thus, the magnetic wiring circuit board 1 was obtained.

Examples 2 to 4

The magnetic wiring circuit board 1 was obtained in the same manner as in Example 1, except that the shape, the size, and the like of the suppressing portion 5 were changed according to Table 1.

Comparative Example 1

The magnetic wiring circuit board 1 prior to forming the suppressing portion 5 (in the middle of manufacturing) shown in FIG. 3B was obtained as the magnetic wiring circuit board 1 of Comparative Example 1 as it was.

In other words, the magnetic wiring circuit board 1 was not provided with the suppressing portion 5.

(Evaluation 1)

Suppression of Magnetic Coupling (First Rate of Change and Second Rate of Change of Inductance)

One end portions in the second direction of the first wiring portion 41 and the second wiring portion 42 in the second wiring 3B in each of the magnetic wiring circuit boards 1 of Examples 1 and 2, and Comparative Example 1 were connected to an impedance analyzer (manufactured by Agilent Technologies, Inc.: 4294A) to measure the inductance of the other wiring 3 adjacent to the first wiring 3, and this inductance was used as the reference inductance.

Then, the inductance of the second wiring 3 (3B) was measured in a state where the one end portions in the second direction of the first wiring portion 41 and the second wiring portion 42 of the first wiring 3A were connected to each other with another wiring to short-circuit the first wiring 3A, and the difference between this value and the reference inductance described above was obtained. By dividing this by the reference inductance, the first rate of change of the inductance was obtained.

Furthermore, the inductance of the second wiring 3B was measured in a state where the one end portions in the second direction of the first wiring portion 41 and the second wiring portion 42 of the third wiring 3 (3C) were connected to each other with another wiring to short-circuit the third wiring 3C (i.e., a state where both the first wiring 3A and the third wiring 3C located on both sides in the first direction of the second wiring 3B were short-circuited), and the difference between this value and the reference inductance described above was obtained. By dividing this by the reference inductance, the second rate of change of the inductance was obtained.

Figure 10:
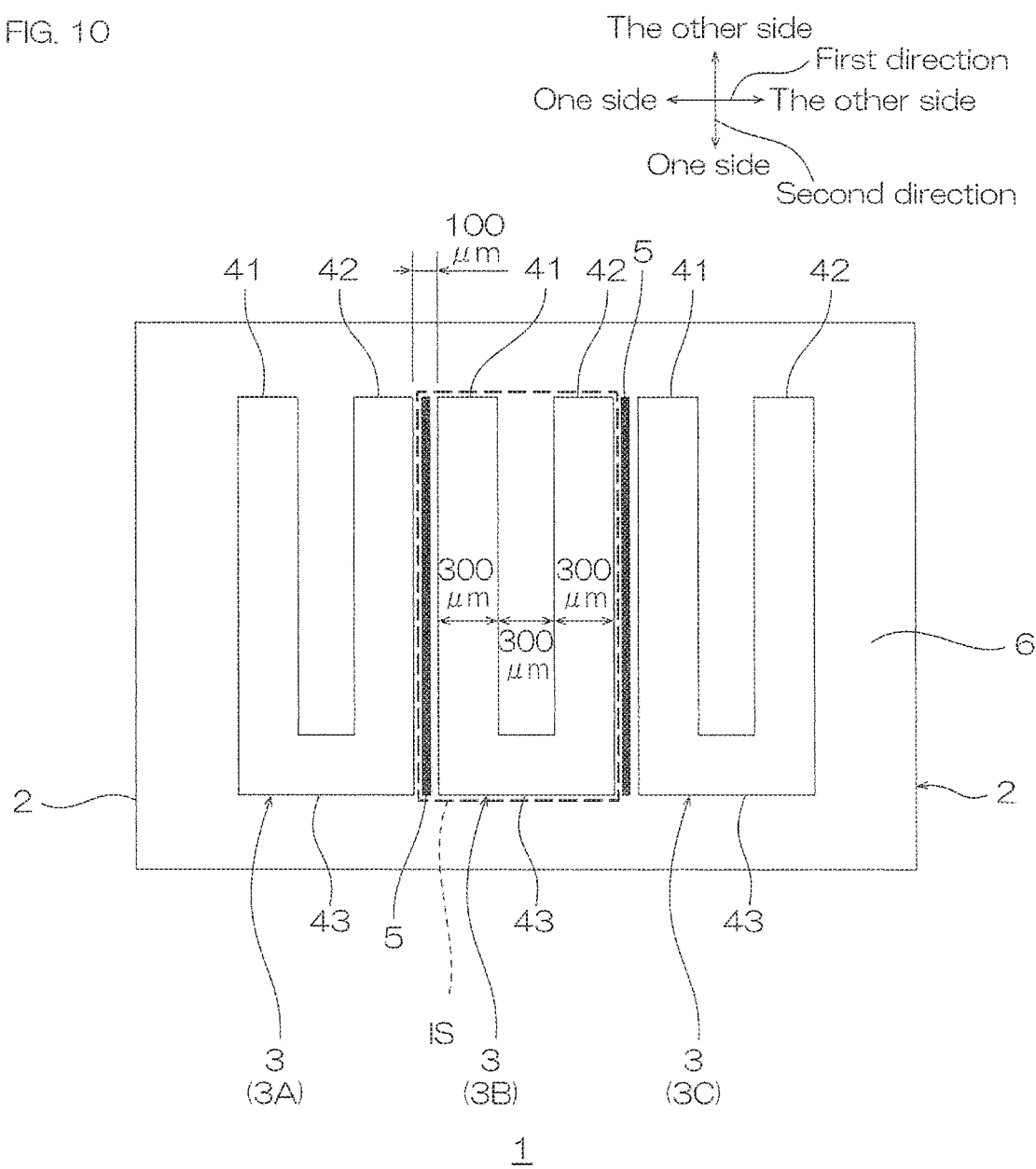
FIG. 10 shows a plan view showing a magnetic wiring circuit board of Example.

In addition, as shown by a thick broken line in FIG. 10, the occupation area of the second wiring 3B and the magnetic layer 4 adjacent thereto on one side in first direction thereof in the magnetic wiring circuit board 1 of Examples 1 and 2, and Comparative Example 1 (i.e., the occupation area of the inductor by the second wiring 3B and the corresponding magnetic layer 4) (the area obtained by subtracting the occupation area of the slit 25 in the case of the presence of the slit 25) IS was obtained. By dividing the above-described reference inductance by the occupation area, the inductance density was obtained.

Figure 11:
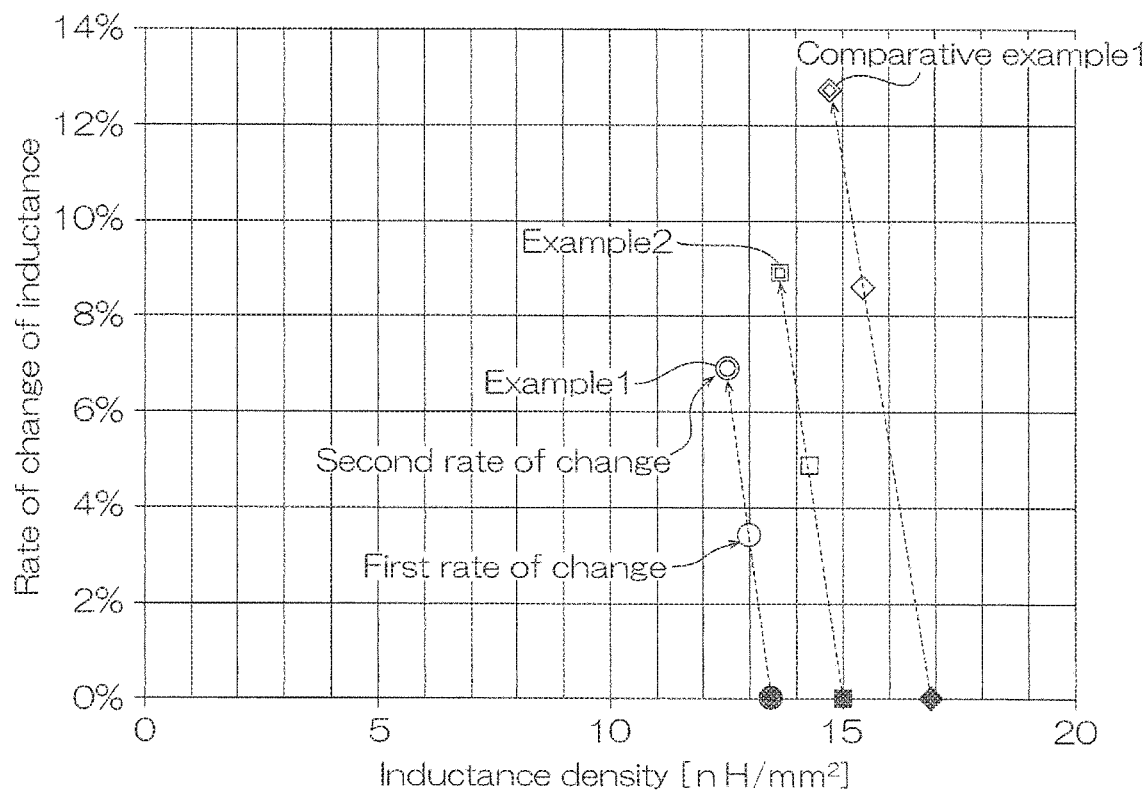
FIG. 11 shows a graph of Evaluation 1 in Examples.

The relationship between the first rate of change and the second rate of change of the inductance, and the inductance density is shown in FIG. 11.

In FIG. 11, a single mark (in Example 1, ○ (circle)) was a plot of the first rate of change of the inductance and the corresponding inductance density. A double mark (in Example 1, ◎ (double rings)) was a plot of the second rate of change of the inductance and the corresponding inductance density. Medium black (in Example 1, ● (black circle)) was a plot of the rate of change of the reference inductance (i.e., zero) and the corresponding inductance density.

In FIG. 11, it is indicated that as the first rate of change and the second rate of change of the inductance are higher, the magnetic coupling between the wirings 3 is strongly affected.

(Evaluation 2)

Suppression of Magnetic Coupling (Rate of Change of Inductance)

Figure 12:
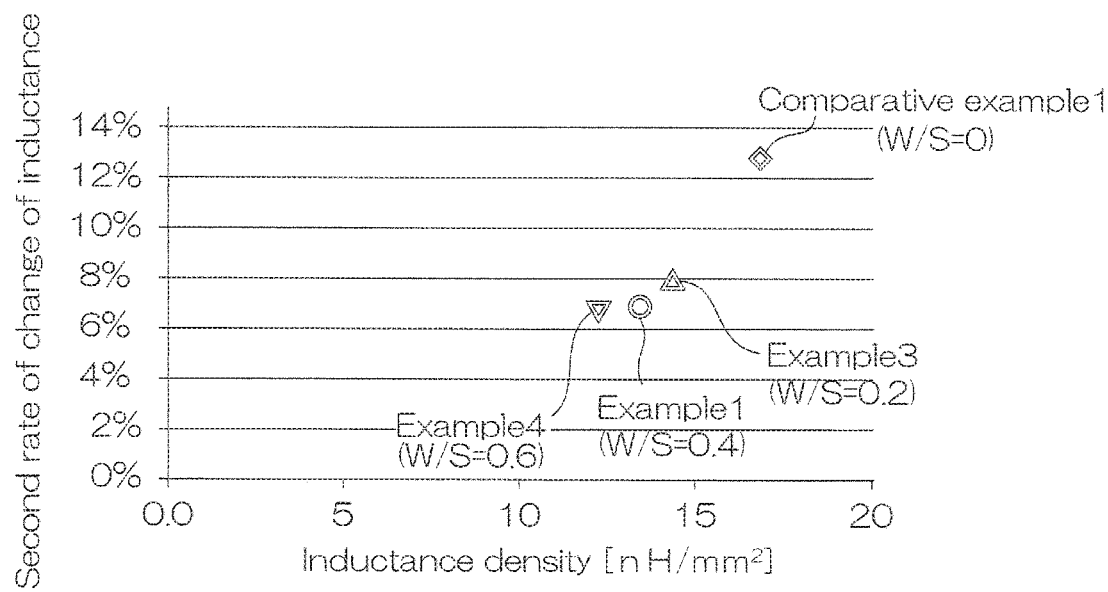
FIG. 12 shows a graph of Evaluation 2 in Examples.

The second rate of change and the corresponding inductance density of each of the magnetic wiring circuit boards 1 of Examples 1, 3, and 4, and Comparative Example 1 are obtained, and these are shown in FIG. 12.

In FIG. 12, it is indicated that as the rate of change of the inductance is higher, the magnetic coupling of the wirings 3 is strongly affected.

(Consideration 1)

As shown in FIG. 11, when Examples 1 and 2, and Comparative Example 1 are compared, in Examples 1 and 2 including the suppressing portion 5, as compared with Comparative Example 1 without it, it can be seen that the influence of the magnetic coupling of the wirings 3 is small.

When Examples 1 and 2 are compared, it can be seen that the influence of the magnetic coupling of the wirings 3 is smaller in Example 1 in which the suppressing portion 5 reaches the first insulating surface 6 than in Example 2 in which the suppressing portion 5 reaches halfway in the thickness direction of the insulating layer 2.

(Consideration 2)

As shown in FIG. 12, when Examples 1 and 3, and Comparative Example 1 are compared, it can be seen that the influence of the magnetic coupling of the wirings 3 is smaller as the W/S approaches from 0 to 0.4.

On the other hand, when Examples 1 and 4 are compared, even if the W/S increases from 0.4 toward 0.6, it can be seen that there is substantially no effect of suppressing the magnetic coupling of the wirings 3, and only the inductance density decreases. This is considered to be caused by easy spread of the magnetic field generated from the wiring 3 to the wiring 3 adjacent thereto due to the excessive width W of the suppressing portion 5. Therefore, in order to effectively decrease the influence of the magnetic coupling of the wirings 3, it is only necessary that the W/S is 0.4 or less.

TABLE 1

| | Slit (Suppressing Portion) | Overlapped Length OL/Thickness of Wiring | W (μm) | S (μm) | W/S | Suppression of Magnetic Coupling | Inductance (Magnetic Permeability) |
|---|---|---|---|---|---|---|---|
| Ex. 1 | Until First Insulating Surface | 1 | 40 | 100 | 0.4 | Excellent | Excellent |
| Ex. 2 | Halfway | 0.5 | 40 | 100 | 0.4 | Good | Excellent |
| Ex. 3 | Until First Insulating Surface | 1 | 20 | 100 | 0.2 | Excellent | Excellent |
| Ex. 4 | Until First Insulating Surface | 1 | 60 | 100 | 0.6 | Excellent | Good |
| Comparative Ex. 1 | — | | 0 | 100 | 0 | Bad | Excellent |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The magnetic wiring circuit board of the present invention is, for example, used in wireless power transmission (wireless power supply and/or wireless power receiving), wireless communication, sensors, passive components, and the like.

DESCRIPTION OF REFERENCE NUMBER

1 Magnetic wiring circuit board
2 Insulating layer
4 Magnetic layer
5 Suppressing portion
6 First insulating surface
8 First wiring surface
20 Filling portion
25 Slit
41 First wiring portion
42 Second Wiring portion
11 First magnetic surface
IL Phantom line
W Width
S Interval between wirings

The invention claimed is:

1. A magnetic wiring circuit board comprising:
an insulating layer,
a plurality of wiring portions spaced from each other in a direction perpendicular to a thickness direction on one surface in the thickness direction of the insulating layer,
a magnetic layer disposed so as to embed the plurality of wiring portions on the one surface in the thickness direction of the insulating layer and having one surface in the thickness direction spaced at one side in the thickness direction with respect to one surfaces in the thickness direction of the plurality of wiring portions, and
a suppressing portion for suppressing magnetic coupling of at least the two wiring portions formed so as to extend from the one surface in the thickness direction of the magnetic layer toward the other side in the thickness direction relative to a phantom line connecting the one surfaces in the thickness direction of at least the two wiring portions in the magnetic layer between at least the two wiring portions adjacent to each other.

2. The magnetic wiring circuit board according to claim 1, wherein
the suppressing portion reaches the one surface in the thickness direction of the insulating layer.

3. The magnetic wiring circuit board according to claim 1, wherein
the suppressing portion is a slit formed in the magnetic layer.

4. The magnetic wiring circuit board according to claim 1, wherein
a ratio (W/S) of a length W in the direction perpendicular to the thickness direction in the suppressing portion to a length S in the direction perpendicular to the thickness direction between at least the two wiring portions is 0.4 or less.

* * * * *